United States Patent [19]

Kikuchi et al.

[11] Patent Number: 4,601,095
[45] Date of Patent: Jul. 22, 1986

[54] PROCESS FOR FABRICATING A SCHOTTKY-BARRIER GATE FIELD EFFECT TRANSISTOR

[75] Inventors: Kenichi Kikuchi; Michitomo Iiyama; Toshiki Ebata; Hideki Hayashi, all of Osaka, Japan

[73] Assignee: Sumitomo Electric Industries, Ltd., Osaka, Japan

[21] Appl. No.: 361,070

[22] Filed: Mar. 23, 1982

[30] Foreign Application Priority Data

| Oct. 27, 1981 | [JP] | Japan | 56-172502 |
|---|---|---|---|
| Oct. 27, 1981 | [JP] | Japan | 56-172503 |
| Nov. 5, 1981 | [JP] | Japan | 56-178193 |
| Nov. 6, 1981 | [JP] | Japan | 56-178535 |
| Nov. 9, 1981 | [JP] | Japan | 56-180052 |

[51] Int. Cl.[4] .................. H07L 21/263; H07L 21/26
[52] U.S. Cl. ........................ 29/571; 29/576 B; 148/1.5; 148/187
[58] Field of Search ............ 148/1.5, 187; 29/571, 29/576 B; 357/23, 91

[56] References Cited

U.S. PATENT DOCUMENTS

| 3,997,367 | 12/1976 | Yau | 148/1.5 |
|---|---|---|---|
| 4,222,164 | 9/1980 | Triebwasser | 29/571 |
| 4,244,097 | 9/1980 | Cleary | 29/571 |
| 4,312,681 | 1/1982 | Rupprecht et al. | 148/1.5 |
| 4,344,980 | 8/1982 | Yoder | 148/1.5 |
| 4,396,437 | 8/1983 | Kwok et al. | 148/1.5 |
| 4,400,866 | 8/1983 | Yeh et al. | 29/571 |
| 4,426,765 | 1/1984 | Shahriary et al. | 29/571 |
| 4,426,767 | 1/1984 | Swanson et al. | 29/571 |
| 4,452,646 | 6/1984 | Zuleeg | 148/1.5 |
| 4,473,939 | 10/1984 | Feng et al. | 29/571 |

FOREIGN PATENT DOCUMENTS

0005461 11/1979 European Pat. Off. .
2824026 12/1979 Fed. Rep. of Germany .

OTHER PUBLICATIONS

IBM Technical Disclosure Bulletin, vol. 21, No. 5, Oct. 1978, Reestablishing Parallelism After RIE Etching/H. B. Pogge.
IBM Technical Disclosure Bulletin, vol. 22, No. 7, Dec. 1979, Self–Aligned Silicon MESFET or JFET/T. H. Ning, P. M. Solomon and H. N. Yu.
Technology News 2119 EDN, vol. 23, No. 17 (1978.09) GaAs Metal–Semiconductor Technology Promises Gigahertz LSI at Low Power.

*Primary Examiner*—Upendra Roy

[57] ABSTRACT

A process for fabricating a Schottky-barrier gate field effect transistor, consists of forming an active layer of one electrically conductive type semiconductor crystal on one surface of a high resistivity or semi-insulating semiconductor crystal substrate, the active layer having a first active layer whose thickness and carrier concentration are so chosen as to give a predetermined value of pinch-off voltage and a second active layer having a carrier concentration which is substantially equal to that of the first active layer and having a larger thickness than that of the first active layer and provided on both sides of the first active layer; the first shallow active layer is provided with a Schottky-barrier gate electrode correctly positioned on the surface part and the second thick active layer is provided with a source electrode and drain electrode on the surface part.

19 Claims, 51 Drawing Figures

(A)

(B)

(C)

(D)

(E)

(F)

(A)

(B)

(C)

(D)

(E)

(F)

(G)

(B)

(C)

(D)

(E)

(F)

(A)

(B)

(C)

(B)

(C)

(D)

(A)

(B)

(C)

(A)

(A)

(B)

(C)

(D)

PROCESS FOR FABRICATING A SCHOTTKY-BARRIER GATE FIELD EFFECT TRANSISTOR

BACKGROUND OF THE INVENTION

1. Field of the Invention

This invention relates to a process for fabricating a Schottky-barrier gate field effect transistor.

2. Description of the Prior Art

Schottky-barrier gate field effect transistors (which will hereinafter be referred to as "MESFETS") have widely been used as an element for amplification or oscillation, in particular, in microwaves, and as well known in the art, are excellent as a basic element for an integrated circuit of ultra-high speed operation.

The structure of the most commonly used MESFET is as shown in FIG. 1, in which 1 is a high resistance or semi-insulating semiconductor crystal substrate, 2 is an electrically conductive semiconductor crystal layer generally called an active layer, 3 is a Schottky-barrier gate electrode and 4 and 5 are respectively a source electrode and drain electrode having ohmic characteristics. The carrier concentration Nd and thickness a of the active layer 2 have a relationship with the pinch-off voltage Vp of MESFET, represented by the following formula (1):

$$V_p = V_b [(qN_d)/2\epsilon] a^2 \quad (1)$$

where Vb is a built-in voltage, $\epsilon$ is a dielectric constant of the semiconductor and q is an electronic charge.

Vp is given from the requirements of a circuit design and Nd and a are determined useing the formula (1) so as to satisfy the value of Vp.

One disadvantage of the prior art structure as shown in FIG. 1 is that the transconductance gm obtained is not sufficiently large and the noise characteristic is deteriorated, because the resistance between gate 3 and source 4 or gate 3 and drain 5 is high. In particular, where the absolute value of the pinch-off voltage Vp is small or in the case of "normally off" (Vp>0), Nd- and a-values should be small and thus the series resistance between a gate and source is larger as is evident from the formula (1). When active layer 2 is of a GaAs crystal, there is a high density surface state on crystal surface areas 6 and 7 between a gate and source and between a gate and drain, whereby the surface potential is substantially fixed and a depletion layer is formed near the surface of the semiconductor crystal, resulting in a larger series resistance between a gate and source. This is a very important problem.

As a method of solving this problem, it has hitherto been proposed to make thicker active layers 9 and 10 between a gate and source and between a gate and drain than active layer 8 directly under the gate, as shown in FIG. 2. According to this method, however, it is required to determine the thickness of active layer 8 and the carrier concentration so as to satisfy the condition of the formula (1), but it is difficult to control precisely and reproducibly the thickness of the part 8 in such a recess structure by etching and the like in view of the present technical level. This structure is obtained by forming a uniform active layer having a thickness desired for the portion directly under source electride 4 and drain electrode 5, making thinner only part 8 to be directly under gate electrode 3 by etching and the like and then forming electrodes 4, 5 and 3. However, this structure has the disadvantage that not only a fine photolithography for forming an electrode is difficult, but also a much higher precision is required for etching control of an active layer thus resulting in a lowered yield, because the surface of the active layer is not flat.

SUMMARY OF THE INVENTION

It is an object of the present invention to provide a process for fabricating an improved Schottky-barrier gate field effect transistor whereby the prior art disadvantages can be overcome.

It is another object of the present invention to provide process for fabricating a Schottky-barrier gate field effect transistor which is excellent in its microwave properties as well as in its yield.

These objects can be attained by fabricating a Schottky-barrier gate field effect transistor by a process in which an active layer of one electrically conductive type semiconductor crystal is formed on one surface of a high resistivity or semi-insulating semiconductor crystal substrate; the active layer consists of a first active layer whose thickness and carrier concentration are so chosen as to give a predetermined value of pinch-off voltage and a second active layer having a substantially similar carrier concentration to the first active layer and a larger thickness than the first active layer and provided on both sides of the first active layer; the first shallow active layer is provided with a Schottky-barrier gate electrode correctly positioned on the surface part thereof and the second thick active layer is provided with a source electrode and drain electrode on the surface part thereof.

BRIEF DESCRIPTION OF THE DRAWINGS

The accompanying drawings are to illustrate the principle and merits of the present invention in more detail.

DETAILED DESCRIPTION OF THE INVENTION

According to the present invention, there is provided a process for the production of a Schottky-barrier gate field effect transistor, which comprises forming a first active layer of one electrically conductive type semiconductor crystal with a thickness and carrier concentration chosen so as to give a predetermined pinch-off voltage, forming a stripe-like resist pattern thereon, introducing an impurity for giving the same electrically conductive type as the first active layer into the first active layer by ion implantation or thermal diffusion selectively through the pattern as a mask to form a second deeper active layer at the both sides of the first active layer, forming a reversed pattern rightly to the stripe-like pattern by the lift off method, vapor depositing a Schottky gate metal thereon, forming a Schottky gate electrode positioned correctly on the first active layer by removing the reversed pattern mask and forming a source electrode and a drain electrode on the second deeper active layer.

The present invention will now be illustrated in more detail through the embodiments of the present invention. It is important for decreasing the series resistance that a gate electrode, at least, covers the whole of a shallow active layer, but on the other hand, a part extending over a deep active layer due to a much larger length of the metallic electrode than that of the shallow active layer does increase the gate capacitance and deteriorate the high frequency characteristics and does not contribute to an effective operation of the field effect transistor. Ideally speaking, therefore, it is desirable that a shallow active layer and a gate electrode metal have a same length and are formed correctly on a same site. This first embodiment is to attain the above described purpose and the cross-sectional structure of a MESFET is as shown in FIG. 3.

Figure 3:
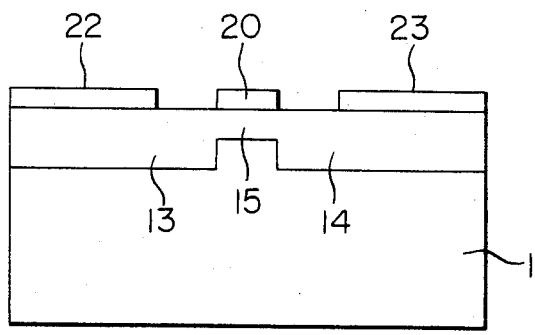
FIG. 3 is a cross-sectional view of the first embodiment of the field effect transistor according to the present invention.

In the MESFET of FIG. 3, on semiconductor crystal substrate 1 are provided shallow active layer 15 under Schottky-barrier gate electrode 20, deep active layer 13 under source electrode 22 and under the area between the gate and source electrodes and deep active layer 14 under drain electrode 23 and under the area between the gate and drain electrodes, and this MESFET has the feature that both the shallow active layer 15 and the gate electrode 20 have a same length and are formed correctly on a same site.

Figure 4:
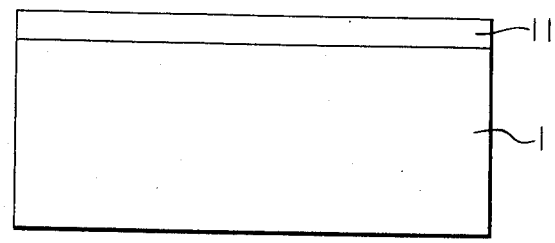
FIGS. 4 (A), (B), (C), (D), (E) and (F) are cross-sectional views used to illustrate, in order, the steps of making the transistor of the present invention as shown in FIG. 3.
Figure 4:
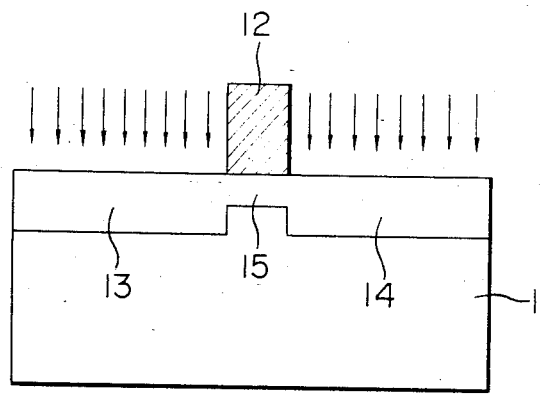
Figure 4:
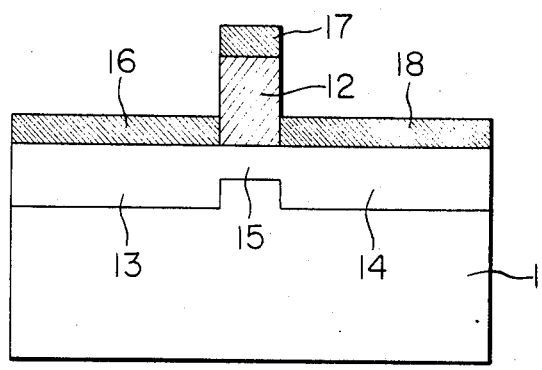
Figure 4:
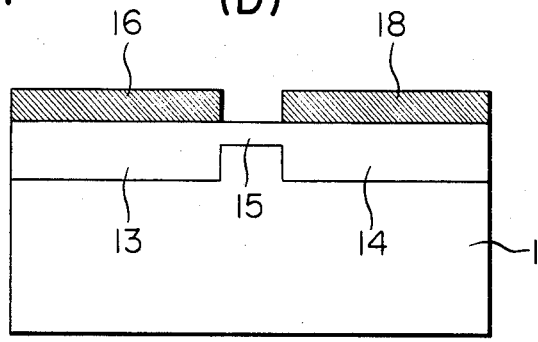
Figure 4:
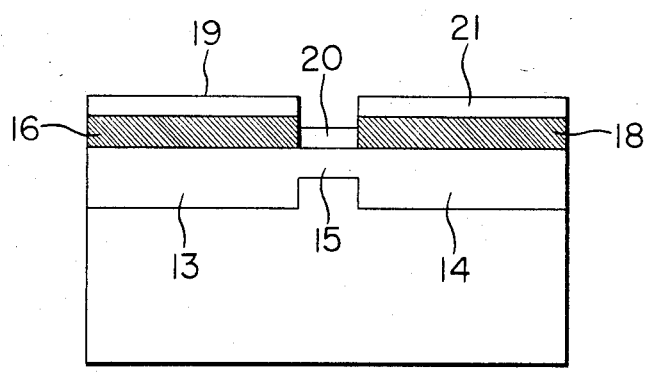
Figure 4:
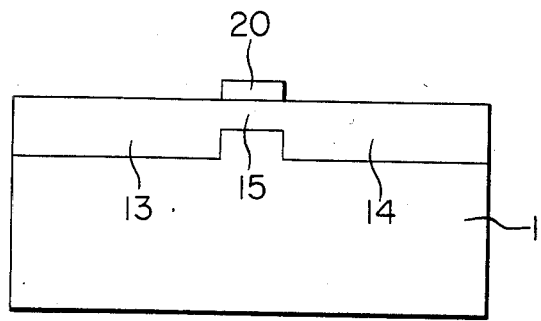

FIG. 4 (A) to FIG. 4 (F) are cross-sectional views used to illustrate a process of making a MESFET according to the present invention. Referring to FIG. 4 (A), on the surface of a high resistivity or semi-insulating semiconductor crystal substrate 1 is formed one electrically conductive type semiconductor crystal layer 11 with such a thickness and carrier concentration that a desired pinch-off voltage, e.g. $+0.3$ to $-3$ V, is obtained according to the formula (1). Preparation of the semiconductor crystal layer 11 is generally carried out by the vapor phase epitaxial (CVD epitaxial) method, liquid phase epitaxial (LPE) method or a method of implanting an impurity ion in semi-insulating substrate 1. When $^{28}Si^+$ ion is implanted in a semi-insulating crystal substrate of GaAs to obtain an active layer (normally off) with a pinch-off voltage of 0 V, for example, the implantation is carried out with a $^{28}Si^+$ implantation quantity of $5.5 \times 10^{11}$ dose/cm$^2$ and an implantation voltage of 120 KeV where the doping efficiency is regarded as 100%. The carrier concentration distribution in the depth direction at this time is shown by the solid line 26 in FIG. 5.

Then stripe-like implantation mask 12 is formed on the surface of the above described crystal layer 11 as shown in FIG. 4 (B). As the material of mask 12, SiO$_2$ is suitable, but any other materials can be also used which are capable of being used as a selective mask for ion implantation, and being readily formed and stripped. An impurity capable of giving the same conduction type as crystal layer 11 is then introduced into the crystal substrate by the ion implantation method or thermal diffusion method using mask 12 to form deep active layers 13 and 14.

When the above described deep active layers 13 and 14 are formed by ion implantation, the implantation energy is made larger than that used for the ion implantation of shallow active layer 11 so as to obtain a deeper implantation than in shallow active layer 11 and the implantation quantity is preferably chosen in such a range that the final peak carrier concentration is not too large to prevent a dielectric breakdown by a voltage applied to the gate and an increase of gate capacitance. When an implantation energy of 400 KeV and an implantation quantity of $1.07 \times 10^{12}$ dose/cm$^2$ are chosen as such implantation conditions, for example, the theoretical value of the carrier concentration distribution is shown by the broken line 27 in FIG. 5. The concentration of non-masked parts 13 and 14 corresponds to the sum of the concentration by the first shallow ion implantation plus the concentration by the second deep ion implantation, which distribution is shown by the chain line 28 in FIG. 5.

Figure 1:
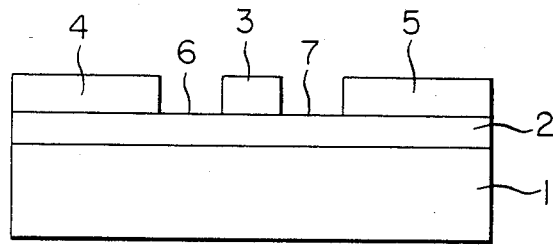
FIG. 1 and FIG. 2 are cross-sectional views of the prior art transistors.
Figure 2:
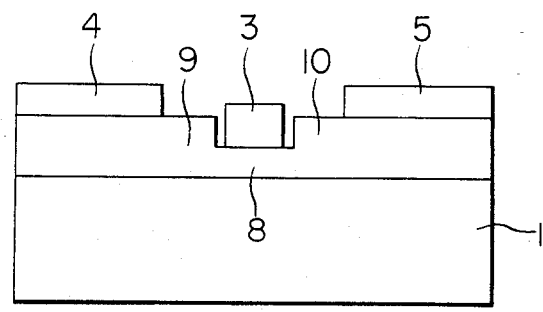
Figure 5:
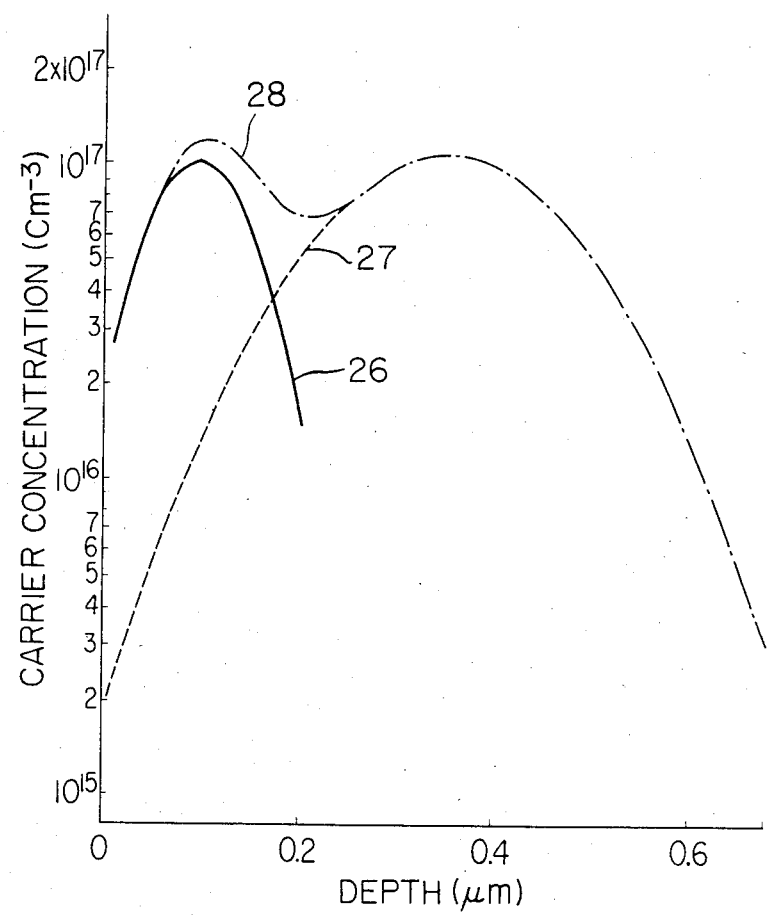
FIG. 5 is a graph showing a carrier concentration distribution in an active layer.

As can be seen from FIG. 5, the total number of carriers in deep active layers 13 and 14 is about three times higher than that in the principal active layer 15 for giving a pinch-off voltage and, consequently, at least the gate-source resistance can be reduced to ⅓ or less as compared with the prior art method wherein active layers 13 and 14 are formed in the same manner as active layer 15 as shown in FIG. 1. When active layer 13, 14 or 15 is formed by ion implantation, annealing is carried out for the purpose of electrically activating the ion implanted layer. During the same time, when the crystal substrate is of a compound semiconductor such as GaAs, InP and the like, the annealing should be carried out at a temperature of 700° to 850° C. for several tens of minutes while protecting the surface from deterioration by the use of a controlled As or P partial pressure.

Then, Au thin films 16, 17 and 18 are formed on the whole surface of the substrate by vapor deposition in a vacuum as shown in FIG. 4 (C).

Thereafter, the $SiO_2$ film 12 is removed by the use of an etchant containing HF while the Au thin film 17 on the $SiO_2$ film 12 is simultaneously removed (lifted off), thus obtaining Au film patterns 16 and 18 which are a reversal image of the pattern of the $SiO_2$ as shown in FIG. 4 (D).

A metal to be a Schottky-barrier gate electrode, for example, Al is vapor-deposited on the whole surface thereof to form vapor-deposited films 19, 20 and 21 as shown in FIG. 4 (E).

Then, the Au thin films 16 and 18 are removed with an etchant containing iodine while Al films 19 and 21 on Au films 16 and 18 are simultaneously removed by being lifted off, whereby a Schottky-barrier gate electrode 20 is formed on a same site just above the shallow active layer 15 as shown in FIG. 4 (F).

If the Schottky gate electrode 20 is not subjected to correct alignment and is somewhat shifted, there arises a part of shallow active layer on which there is no Schottky gate electrode and the series resistance of this part is large. The method of the present invention, on the contrary, has the advantage that due to self-alignment there is scarcely a position shift.

Finally, source electrode 22 and drain electrode 23 are formed in a known manner to thus obtain an improved MESFET as shown in FIG. 3.

The second embodiment of the present invention will now be illustrated, which corresponds to another embodiment having the same object and advantage as the first embodiment. Thus, the cross sectional view of this embodiment is similar to that of the first embodiment, as shown in FIG. 6.

Figure 6:
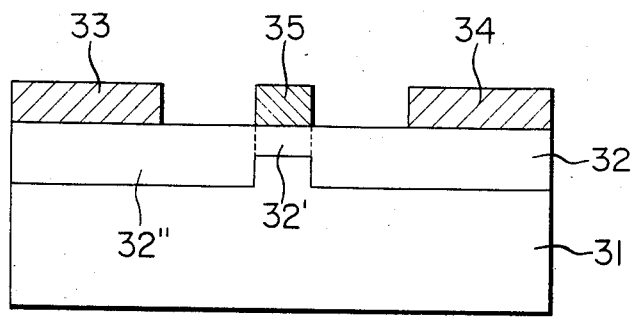
FIG. 6 is a cross-sectional view of the second embodiment of the field effect transistor according to the present invention.

The MESFET of FIG. 6 comprises semi-insulating semiconductor substrate 31 of GaAs, n-type active layer 32, source electrode 33, drain electrode 34 and Schottky-barrier gate electrode 35. In this structure, the surface of the active layer is flat and the thickness of active layern 32" between a gate and source is larger than that of active layer 32' directly under a gate. In particular, active layer 32" and gate electrode 35 are formed based on a same pattern of insulating material by the so-called self-alignment method and accordingly, the position of gate electrode 35 and second active layer 32" is precisely determined.

Figure 7:
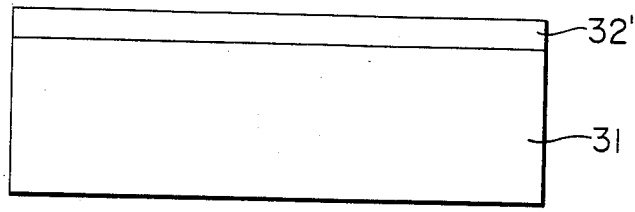
FIGS. 7 (A), (B), (C), (D), (E), (F) and (G) are cross-sectional views used to illustrate, in order, the steps of making the transistor of the present invention as shown in FIG. 6.
Figure 7:
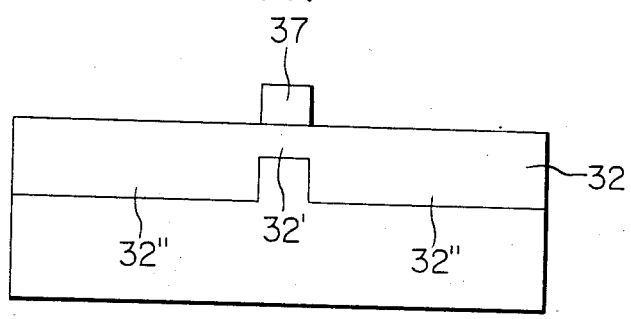
Figure 7:
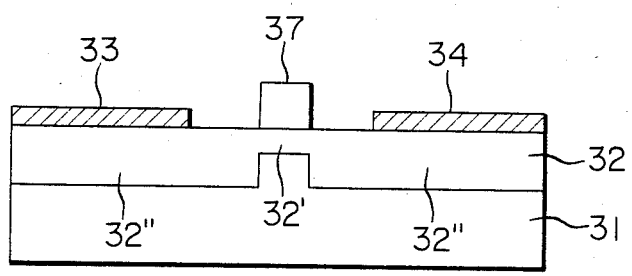
Figure 7:
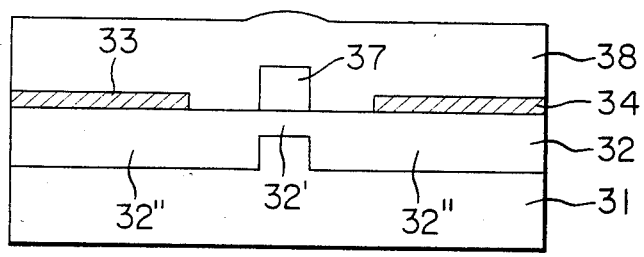
Figure 7:
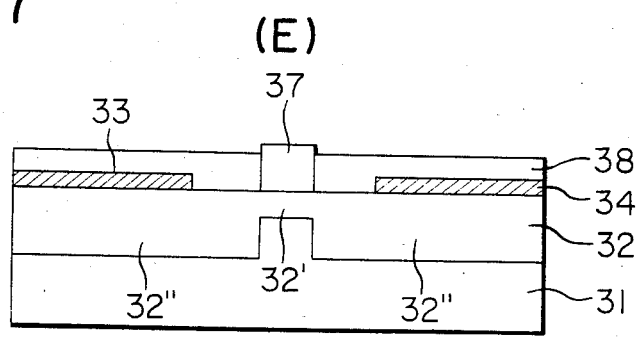
Figure 7:
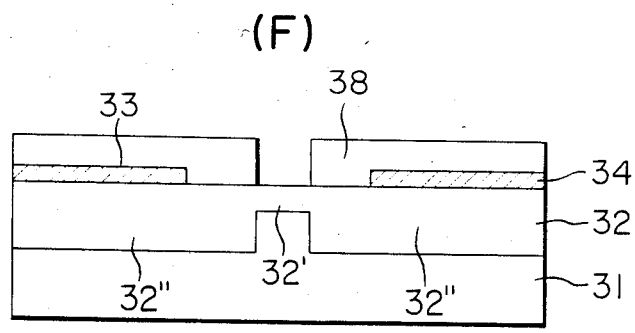
Figure 7:
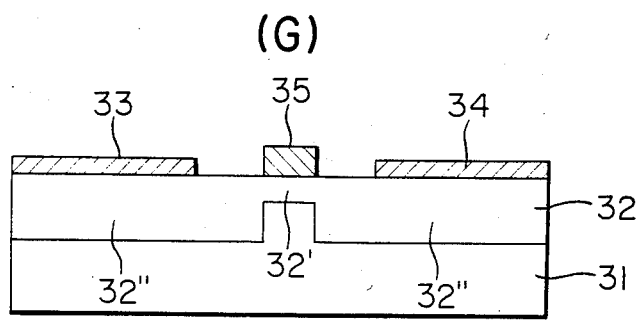

FIG. 7 (A) to FIG. 7 (G) are cross-sectional views used to illustrate a process of making a MESFET according to the present invention. Referring to FIG. 7 (A), on the surface of semi-insulating semiconductor crystal substrate 31 of GaAs is implanted $^{28}Si^+$ ions to form active layer 32' with a uniform thickness. The thickness and carrier concentration of this active layer are chosen so as to realize a desired pinch-off voltage, e.g. +0.3 to −3 V. For example, a carrier concentration of $10^{17}$ cm$^{-3}$ and an active layer with a thickness of 0.1 μm are approximately required for realizing a pinch-off voltage of 0 V and as ion implantation conditions, there are chosen an implantation energy of 120 KeV and an implantation quantity of $5.5 \times 10^{11}$ dose/cm$^2$ where the doping efficiency is regarded as 100%. The theoretical value of the carrier concentration distribution obtained under these conditions is shown by solid line 26 in FIG. 5.

As exemplified in FIG. 7 (B). active layer 32' with a uniform thickness is formed and then pattern 37 consisting of an insulating material is formed thereon. Using this pattern 37 as a mask, the second ion implantation is carried out to form a new active layer 32" on the non-masked site under such conditions that the implantation energy is made larger than that used in the first ion implantation so as to obtain a deeper implantation than in the first ion implantation and the implantation quantity is chosen in such a range that the final peak carrier concentration is not too large to prevent a dielectric breakdown by a voltage applied to the gate and an increase of gate capacitance. When an implantation energy of 400 KeV and an implantation quantity of $1.07 \times 10^{12}$ dose/cm$^2$ are chosen as such implantation conditions, for example, the theoretical value of the carrier concentration distribution is shown by the broken line 27 in FIG. 5.

The concentration of non-masked part 32" in active layer 32 corresponds to the sum of the concentration by the first ion implantation plus that by the second ion implantation, which distribution is shown by the chain line 28 in FIG. 5.

In this embodiment, silicon nitride is used as masking pattern 37. A silicon nitride film of 1.2 μm in thickness is formed by the plasma CVD method and using a resist pattern formed thereon as a mask, it is subjected to plasma etching with a mixed gas comprising $CF_4$ and $O_2$ (5%) to obtain pattern 37 shown in FIG. 7 (B).

While holding pattern 37 as it is, the implanted element is electrically activated by annealing and source electrode 33 and drain electrode 34 are formed on predetermined sites of the active layer 32 as shown in FIG. 7 (C). Thereafter, a reversal pattern 38 with respect to masking pattern 37 is made of an organic resin film having a thickness same as or less than that of pattern 37. To this end, a positive resist is coated in a thickness of about 2.5 μm so as to be almost flat as shown in FIG. 7 (D) and the whole surface is subjected to plasma etching with $O_2$ gas to reduce the thickness thereof by 1.5 μm, thus obtaining a thickness slightly lower than the upper surface of pattern 37 as shown in FIG. 7 (E).

Then only pattern 37 is removed to obtain a resist pattern shown in FIG. 7 (F). In this embodiment, the silicon nitride pattern 37 is only selectively removed by plasma etching using a mixed gas of $CF_4$ and $O_2$ (5%) and the pattern 38 which is positive-negative reversed with respect to pattern 37 is precisely formed. Finally, the process is completed by forming gate electrode 35 on the part from which pattern 37 is removed, as shown in FIG. 7 (G).

The third embodiment of the present invention, which has the same object and merits as the first or second embodiment, will now be illustrated.

Figure 8:
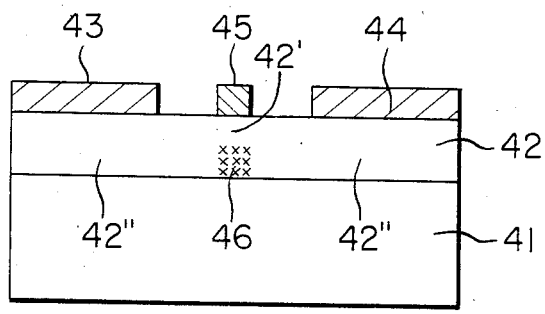
FIG. 8 is a cross-sectional view of the third embodiment of the field effect transistor according to the present invention.

FIG. 8 is a cross-sectional view of the third embodiment of the MESFET according to the present invention, which comprises semi-insulating semiconductor substrate 41 of GaAs, n-type active layer 42, source electrode 43, drain electrode 44, Schottky-barrier gate electrode 45 and a part of n-type active layer 46 inactivated (insulated) by ion implantation. In this structure, the surface of the active layer is flat and the thickness of active layer 42″ between a gate and source is larger than that of active layer 42′ directly under the gate. In particular, active layer 42′ directly under the gate and gate electrode 45 are formed based on a same pattern of insulating material by the so-called self-alignment method and according, the position of gate electrode 45 and second active layer 42″ is precisely determined.

Figure 9:
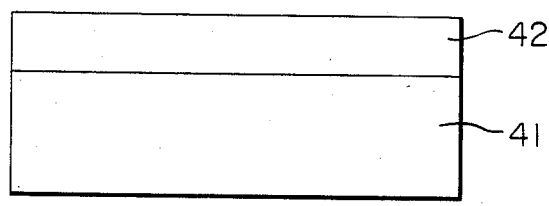
FIGS. 9 (A), (B), (C), (D), (E) and (F) are cross sectional views used to illustrate, in order, the steps of making the transistor of the present invention as shown in FIG. 8.
Figure 9:
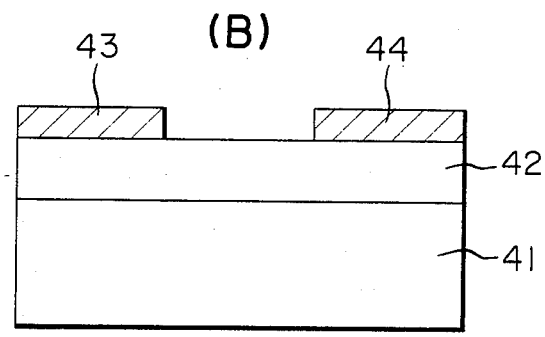
Figure 9:
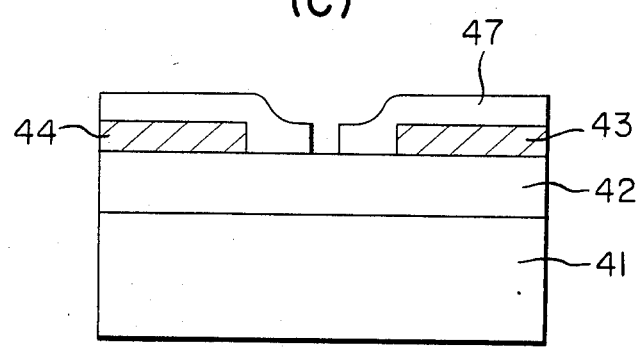
Figure 9:
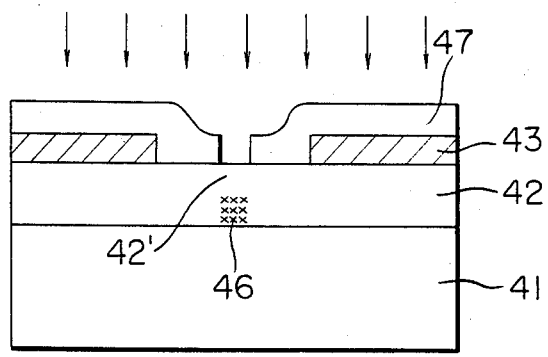
Figure 9:
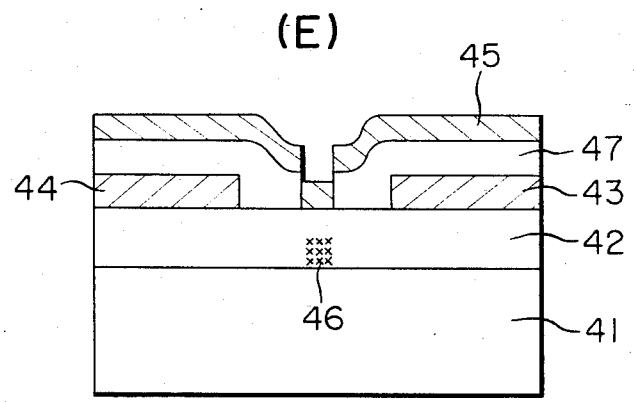
Figure 9:
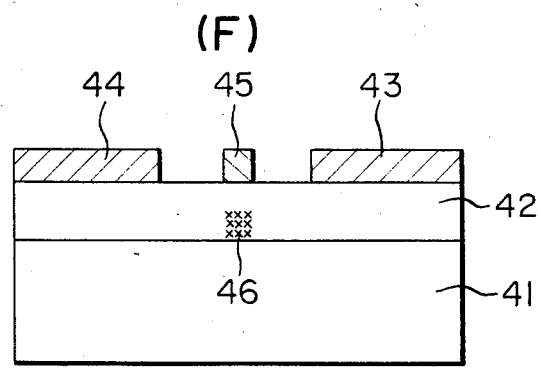

FIG. 9 (A) to FIG. 9 (F) are cross-sectional views used to illustrate a process of making an MESFET according to the present invention. Referring to FIG. 9 (A), on the surface of semi-insulating semiconductor crystal substrate of GaAs 41 is formed an active layer 42 with a uniform thickness by vapor phase or liquid phase growth or implantation of Si+ or the like. The thickness and carrier concentration of this active layer are selected so as to decrease the gate-source resistance.

In a case where the active layer is formed by ion implantation, the implanted element is electrically activated by annealing and source electrode 43 and drain electrode 44 are formed on a predetermined site of active layer 42 as shown in FIG. 9 (B). Then, masking pattern 47 is used for forming gate electrode 45 and inactivated zone 46 and is made of, for example, a photoresist, as shown in FIG. 9 (C). Using this pattern 47 as a mask, an ion implantation for the inactivation is carried out as shown in FIG. 9 (D). As the ion to be implanted, there can be used with attaining the object of the present invention any of ions capable of inactivating the active layer without losing the inactivating function even after forming gate electrode 45.

Figure 10:
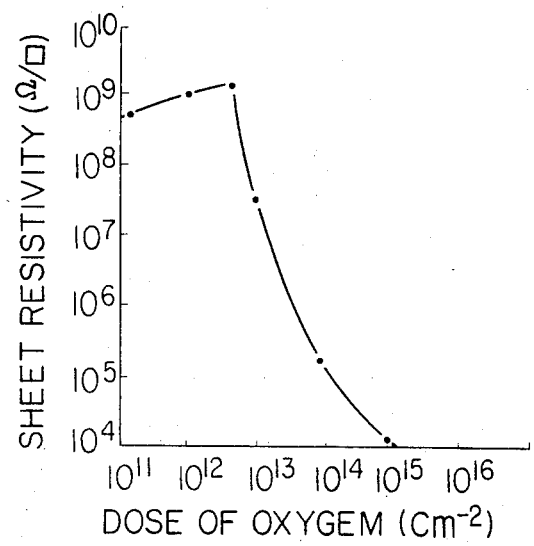
FIG. 10 is a graph showing the relationship between the implantation quantity of oxygen (dose) and sheet resistivity.

In this embodiment, oxygen is used as the inactivating ion. FIG. 10 shows a state in which the resistance of an active layer with a sheet resistance of 150 Ω/□ is varied by implantation of O+ ions. Besides oxygen, chromium or boron can also be used as the inactivating ion. The pinch-off voltage can be adjusted to a desired value by implantation of such an inactivating ion to reduce the effective length of active layer 42′ or to decrease the carrier concentration.

Thereafter, a metal for gate electrode 45 is vapor-deposited as shown in FIG. 9 (E) and masking pattern 47 is removed (lift off method), thus forming gate electrode 45 as shown in FIG. 9 (F).

As the material of masking pattern 47 there can be used any materials capable of serving as a mask for ion implantation and being removed selectively to retain a gate electrode, for example, not only can photoresists be used but materials not reactive with semiconductors, such as organic resin films or inorganic compounds, e.g. silicon oxide, aluminum oxide and aluminum nitride can also be used.

The fourth embodiment of the present invention, which has the same object and merit as the first to third embodiments, will now be illustrated.

Figure 11:
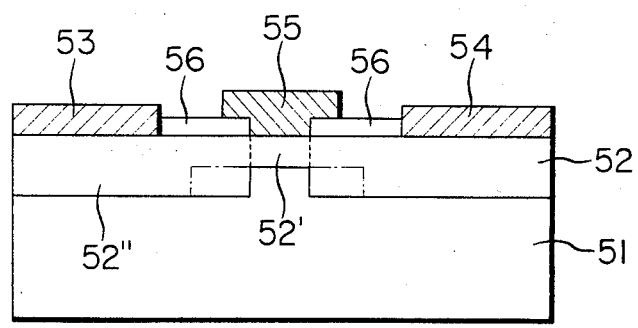
FIG. 11 is a cross-sectional view of the fourth embodiment of the field effect transistor according to the present invention.

FIG. 11 is a cross-sectional view of the fourth embodiment of the MESFET according to the present invention, which comprises semi-insulating semiconductor substrate of GaAs 51, n-type active layer 52, source electrode 53, drain electrode 54, Schottky-barrier gate electrode 55 and insulating film 56. In this structure, the surface of the active layer is flat and the thickness of active layer 52″ between a gate and source is larger than that of active layer 52′ directly under the gate. In particular, active layer 52″ and gate electrode 55 are formed based on a same pattern of insulating material by the so-called self-alignment method and accordingly, the position of gate electrode 55 and second active layer 52″ is precisely determined. Thus, not only the production process is simple but also the yield is increased and at the same time, a fine patterning is possible.

Figure 12:
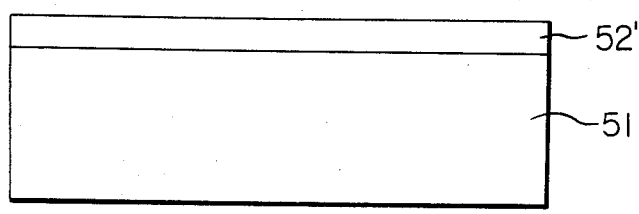
FIGS. 12 (A), (B), (C) and (D) are cross-sectional views used to illustrate, in order, the steps of making the field effect transistor of the present invention as shown in FIG. 11.
Figure 12:
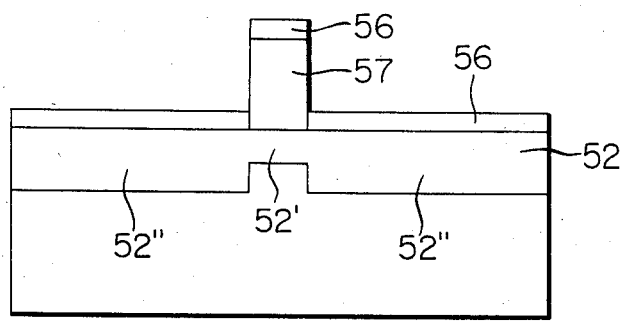
Figure 12:
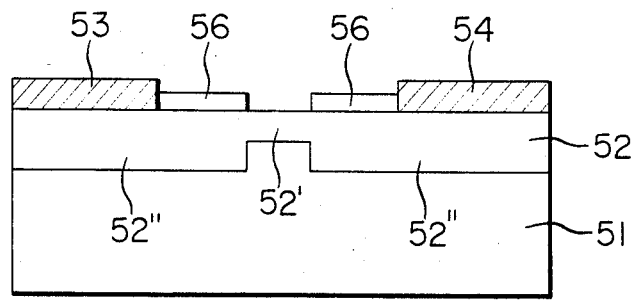
Figure 12:
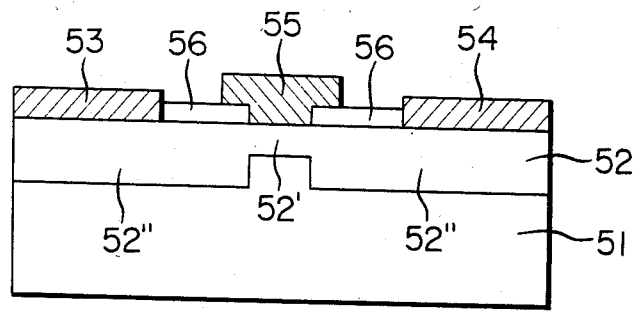

FIG. 12 (A) to FIG. 12 (D) are cross-sectional views used to illustrate a process of making MESFET according to the present invention as shown in FIG. 11. As shown in FIG. 12 (A), in the surface of semi-insulating semiconductor crystal substrate of GaAs 51 is implanted $^{28}Si^+$ ions to form active layer 52′ with a uniform thickness. The thickness and carrier concentration of this active layer are so selected that a desired pinch-off voltage, e.g. $+0.3$ to $-3$ V, be obtained. For example, a carrier concentration of about $10^{17}$ cm$^{-3}$ and an active layer with a thickness of about 0.1 μm are required for realizing a pinch-off voltage of $-2.2$ V and as ion implantation conditions, there are chosen an implantation energy of 120 KeV and an implantation quantity of $2\times10^{12}$ dose/cm$^2$ where the doping efficiency is regarded as 100%. The theoretical value of the carrier concentration distribution obtained under these conditions is shown by the chain line 58 in FIG. 13.

As exemplified in FIG. 12 (B), the active layer 52′ with a uniform thickness is formed an then a pattern 57 consisting of an insulating material is formed thereon. Using this pattern 57 as a mask, the second ion implantation is carried out to form a new active layer, 52″ on the non-masked site under such conditions that the implantation energy is made larger than that used in the first ion implantation so as to obtain a deeper implantation than in the first ion implantation and the implantation quantity is chosen in such a range that the final peak carrier concentration is not too large to prevent the dielectric breakdown by a voltage applied to a gate and an excessive increase of gate capacitance. When an implantation energy of 400 KeV and an implantation quantity of $3.9\times10^{12}$ dose/cm$^2$ are chosen as such implanting conditions, for example, the theoretical value of the carrier concentration distribution is shown by the broken line 59 in FIG. 13. The concentration of non-masked part 52″ in the active layer 52 corresponds to the sum of the concentration by the first ion implantation plus that by the second ion implantation, which distribution is shown by solid line 60 in FIG. 13.

Figure 13:
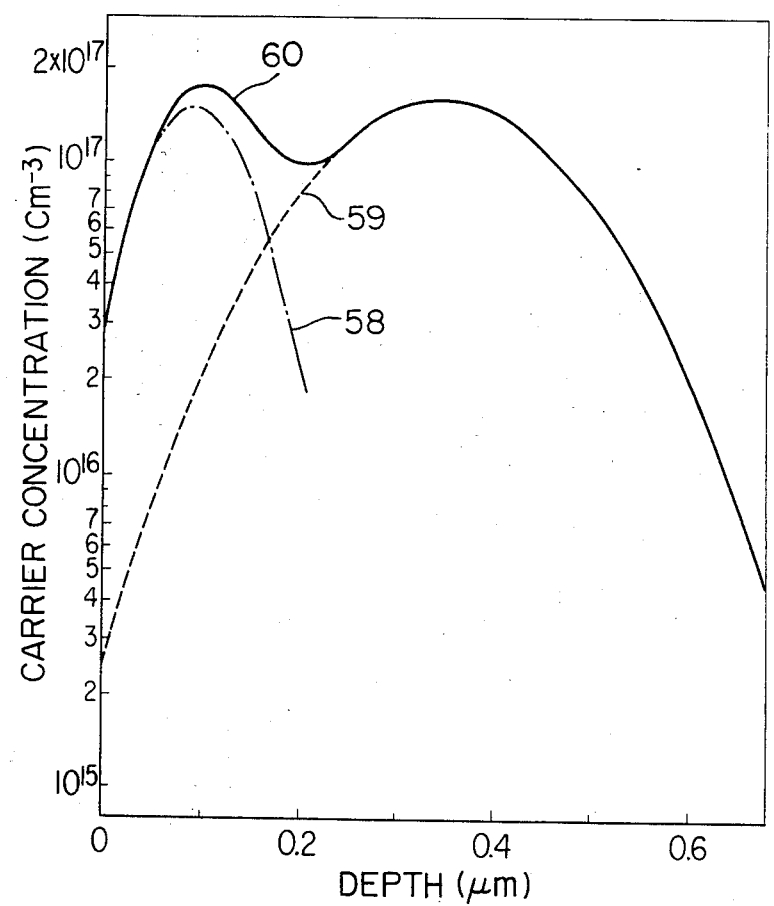
FIG. 13 is a graph showing a carrier concentration distribution in an active layer.
Figure 15:
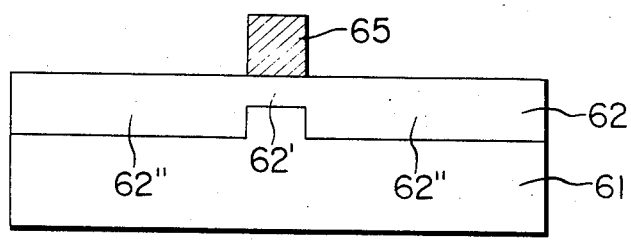
Figure 15:
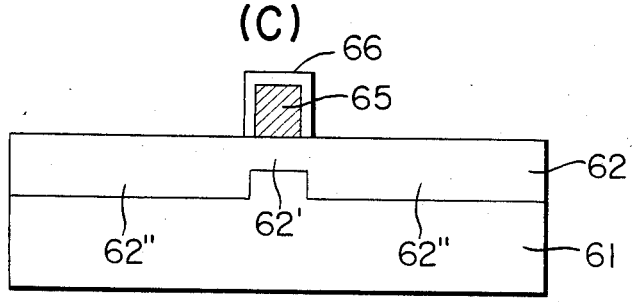
Figure 15:
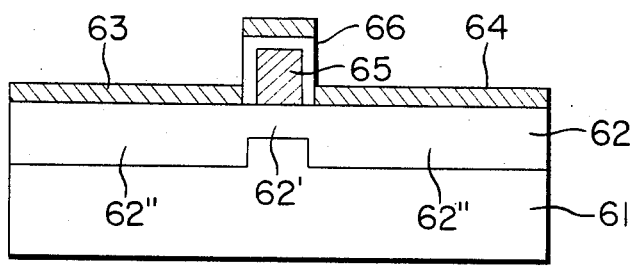

As can be seen from FIG. 13, the total number of carriers in the deep active layer 52″ near source electrode 53 is about three times higher than that in the active layer 52′ directly under gate electrode 55 and, consequently, the gate-source resistance can be reduced to ⅓ or less as compared with the case when the active layer 52′ is uniformly formed. On the other hand, since the peak carrier concentration in the active layer 52″ becomes only about 13% more than that in the active layer 52′, a decrease in the breakdown voltage of a gate and an increase in the capacitance of a gate are held small.

As the masking pattern 57, a for example, silicon oxide film (SiO$_2$) can be used. For example, a SiO$_2$ film with a thickness of 1.2 μm is formed and using a resist pattern formed thereon as a mask, it is subjected to plasma etching with C$_3$F$_8$ gas, thus obtaining pattern 57 shown in FIG. 12 (B). As the material of the masking pattern 57, there can be used any materials which are capable of serving as a mask for ion implantation or thermal diffusion and are capable of being removed selectively from the insulating film 56, such materials being in addition to the SiO$_2$ used in this embodiment.

On the other hand, the insulating film 56 having a resistance to a high temperature process such as annealing can satisfy the requirement of the present invention. Therefore, the material is not limited to silicon nitride only, but materials excellent in heat resistance and not reactive with semiconductors at a high temperature, e.g. 800° C. can also be used, for example, inorganic compounds such as silicon oxide, aluminum oxide and aluminum nitride. As to organic resin films, materials which can be formed on a zone besides pattern 57 and removed selectively from pattern 57 and gate electrode 55 can be used.

Insulating film 56 is provided on the whole surface of the sample as shown in FIG. 12 (B). For example, a silicon nitride (SiN) film 56 is deposited in a thickness of 0.2 μm on the whole surface of the sample by the plasma CVD method, followed by annealing, to thus activate electrically the implanted element.

Thereafter, an insulating film pattern 56, a source electrode 53 and a drain electrode 54 are formed as shown in FIG. 12 (C). For example, as shown in FIG. 12 (C), SiO$_2$ film 57 is removed with a buffered HF solution to obtain a SiN film pattern 56 reversal which is reversed with respect to the SiO$_2$ film pattern 57, and the film 56 is then subjected to window-making (selective etching) by the ordinary photolithography and CF$_4$ plasma etching techniques, followed by forming the source electrode 53 and drain electrode 54.

Finally, the gate electrode 55 is formed by the use of the ordinary vapor deposition and lithographic techniques as shown in FIG. 12 (D).

It is to be noted herein that for the formation of the gate electrode 55, a window of SiN film 56 is formed on a part corresponding correctly to active layer 52' in the preceding step, so the part where gate electrode 55 is directly contacted with an active layer, i.e. the Schottky contact, coincides correctly by the active layer 52' and is not overlapped with active layer 52'. Therefore, as illustrated hereinafter, an MESFET excellent in microwave characteristics without an unnecessary increase of electrostatic capacitance can be obtained.

An example of making the field effect transistor having the structure shown in FIG. 11 by the ion implantation method has been illustrated above, but it can be produced by the thermal diffusion method. That is, a shallow diffusion layer corresponding to active layer 52' or FIG. 12 (A) is firstly formed by contacting a dopant with a small diffusion constant with the surface of a substrate, followed by thermal diffusion, a mixed, diffusion layer consisting of a shallow diffusion layer and a deep diffusion layer, corresponding to active layer 52'' of FIG. 12 (B) is then formed by contacting another dopant with a large diffusion constant with the site except directly under a gate using masking pattern 57 as a shield, followed by thermal diffusion, and finally, electrodes 53, 54 and 55 are formed in an analogous manner to the above described embodiment. Alternatively, the structure of FIG. 11 can be realized by depositing a dopant with a small diffusion constant on a gate part while depositing another dopant with a large diffusion constant on between a gate source, and then subjecting both the zones to thermal diffusion simultaneously.

The shorter the length of active layer 52' in FIG. 11 is, the smaller the series resistance between a gate and source. This is a favorable character. However, the shortening of this length is limited by fine photolithography capabilities.

The relationship between the length of active layer 52' and that of the Schottky contact of gate electrode 55 will now be illustrated. In the case of a "normally on" type, which has a relatively thick active layer 52', even if the length of active layer 52' is somewhat longer than that of gate electrode 55, the properties are not significantly deteriorated, because such a problem does not arise in that the part of active layer 52' not directly under a gate significantly increases the resistance between the gate and source since the active layer 52' is relatively thick and accordingly, the thickness of a depletion layer from the surface toward the inside does not extend to the whole thickness of active layer 52'. On the contrary, in the case of a "normally off" type, in which the shallow active layer 52' in relatively thin, if the length of the shallow active layer 52' is greater than that of gate electrode 55, the depletion layer in the region not directly beneath the gate will extend completely to the bottom of the shallow active layer, thus resulting in a problem such that the resistance between the gate and source is markedly increased and in an extreme case, the electrical current is completely interrupted.

In the "normally off" type, therefore, the length of gate electrode 55 should be larger than that of active layer 52'. However, in the Schottky contact of gate electrode 55, a part thereof exceeding the length of active layer 52' increases only the electrostatic capacity and has no effective funtion, and, accordingly, it is desirable in order to increase the operation speed of the element to hold the part exceeding the layer 52' as short as possible. That is, ideally, it is effective to form the Schottky function of gate electrode 55 and the active layer 52' so as to have equal lengths as shown in FIG. 11.

According to the embodiment of the present invention, the characteristics of the "normally off" type can remarkably be improved because the active layer 52' and the Schottky contact of gate electrode 55 are formed on the same site and with the same length by self-alignment using the insulating film 57.

The fifth embodiment to the present invention will now be illustrated.

Figure 14:
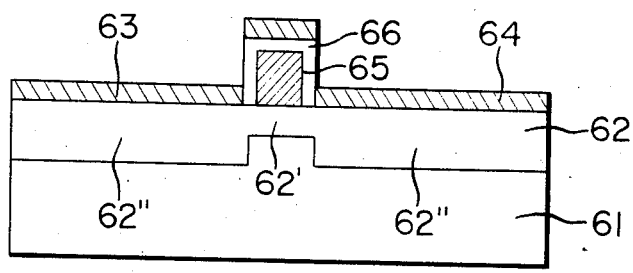
FIGS. 14 (A), and (B) are cross-sectional views of the fifth embodiment of the field effect transistor according to the present invention.
Figure 14:
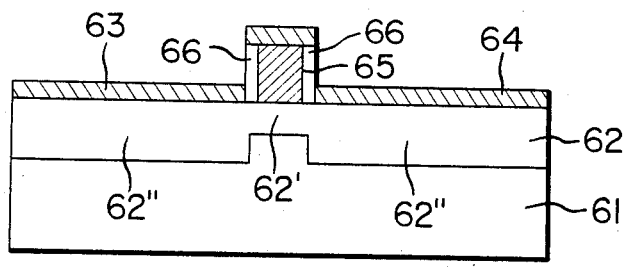

FIG. 14 (A) and FIG. 14 (B) are cross-sectional views of the fifth embodiment of the MESFET according to the present invention, which comprises a semi-insulating semiconductor substrate of GaAs 61, an n-type active layer 62, a source electrode 63, a drain electrode 64, a Schottky-barrier gate electrode 65 stable at high temperatures and an insulating compound film 66 consisting of the gate electrode itself. In the structures of FIG. 14 (A) and (B), the surface of the active layer is flat and the thickness of the active layer 62'' between a gate and source is larger than that of the active layer 62' directly under the gate. In particular, the active layer 62'' is formed using gate electrode as a mask and the source electrode 63 and the drain electrode 64 are formed through the insulating compound film 66 by the so-called self-alignment method. Accordingly, the position relationship of the source electrode 63, the drain electrode and the gate electrode 65 with the second active layer 62'' is precisely determined. Thus, not only the production process simple, but also the yield is increased and at the same time, a fine patterning is possible.

Figure 15:
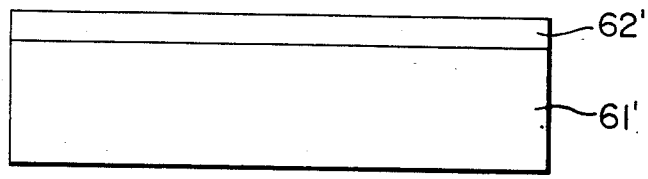
FIGS. 15 (A), (B), (C) and (D) are cross-sectional views to illustrate, in order, the steps of making the transistor of the present invention as shown in FIG. 14 (A).

FIGS. 15 (A) to FIG. 15 (D) are cross-sectional views used to illustrate a process of producing an MESFET according to the present invention as shown in FIG. 14 (A). As shown in FIG. 15 (A), in the surface of semi-insulating semiconductor crystal substrate of GaAs 61 is implanted $^{28}$Si+ ion to form active layer 62' with a uniform thickness. The thickness and carrier concentration of this active layer are so selected that a desired pinch-off voltage, e.g. +0.3 to −3 V be obtained. For example, a carrier concentration of about $10^{17}$ cm$^{-3}$ and an active layer with a thickness of about 0.1 μm are required for realizing a pinch-off voltage of −2.2 V and as ion implantation conditions, there are chosen an implantation energy of 120 KeV and an implantation quantity of $2 \times 10^2$ dose/cm$^2$ where the doping efficiency is regarded as 100%. The theoretical value of the carrier concentration distribution obtained under these conditions is shown by the chain line 58 in FIG. 13.

After forming the active layer 62' with a uniform thickness, the gate electrode 65 consisting of a metal which stable at high temperatures is formed thereon as shown in FIG. 15 (B). Using this gate electrode 65 as a mask, the second ion implantation is carried out to form a new active layer 62'' on the non-masked site under such conditions that the implantation energy is made larger than that used in the first ion implantation so as to obtain a deeper implantation than in the first ion implantation and the implantation quantity is chosen in such a range that the final peak carrier concentration is not too large to prevent the dielectric breakdown by a voltage applied to a gate and to prevent an excessive increase of the gate capatitance. When an implantation energy of 400 KeV and an implantation quantity of $3.9 \times 10^{12}$ dose/cm$^2$ are chosen as such implanting conditions, for example, the theoretical value of the carrier concentration distribution is shown by the broken line 59 in FIG. 13.

The concentration of the non-masked part 62'' in the active layer 62 corresponds to the sum of the concentration by the first ion implantation plus that by the second ion implantation, whose distribution is shown by the solid line 60 in FIG. 13.

As can be seen from FIG. 13, the total number of carriers in the active layer 62'' near source electrode 63 is about three times higher than that in the active layer 62' directly under gate electrode 65 and, consequently, the gate-source resistance can be reduced to about ⅓ or less as compared with the case where the active layer 62' is uniformly formed. On the other hand, since the peak carrier concentration in the active layer 62'' becomes only about 13% more than that in the active layer 62', a decrease of the breakdown voltage of a gate and an increase in the gate capacitance are held very small.

In this embodiment, a Ti-W alloy is used as the gate electrode 65. For example, a Ti-W alloy film with a thickness of 1.2 μm is formed by sputtering and using a resist pattern formed thereon as a mask, it is subjected to plasma etching with a mixed gas of CF$_4$ and O$_2$ (5%), thus obtaining the gate electrode 65 as shown in FIG. 15 (B). Using this electrode as mask, ion implantation is carried out to form the second active layer 62'', followed by electrically activating the implanted element.

As shown in FIG. 15 (C), on the whole surface of gate electrode 65 is formed an insulating compound film 66 consisting of the gate metal itself as a basic material. In this embodiment, the surface of the gate electrode becomes an insulator by plasma anode oxidation to form an insulating compound film having a thickness of 2000 Å. At this time, the surface of the semiconductor substrate is oxidized, but it is easy to remove the GaAs oxide film selectively from the insulating compound film 66 on the gate electrode.

Then, the production process is completed by forming an ohmic metal film on the active layer 62 by vapor deposition in vacuum as shown in FIG. 15 (D) and thus obtaining the source electrode 63 and the drain electrode 64.

Figure 16:
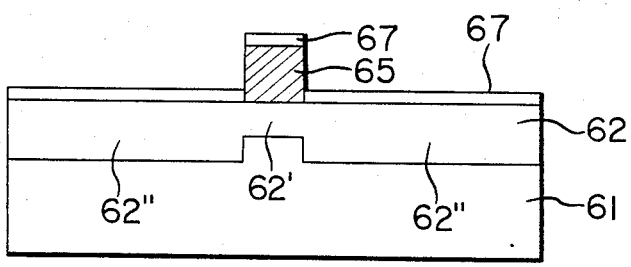
FIGS. 16 (A), (B) and (C) are cross-sectional views to illustrate, in order, the steps of making the field effect transistor of the present invention as shown in FIG. 14 (B).
Figure 16:
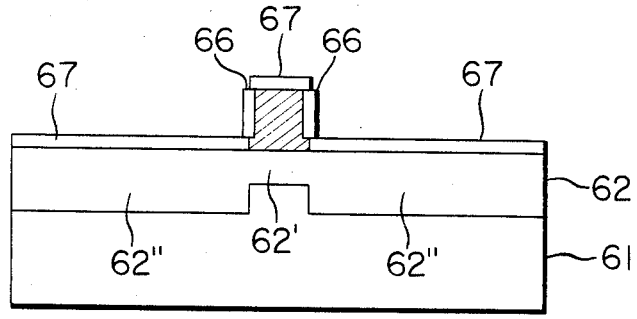
Figure 16:
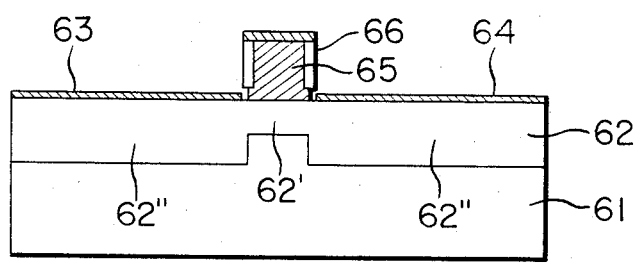

FIG. 16 (A) to FIG. 16 (C) are cross-sectional views used to illustrate a process of making an MESFET according to the present invention as shown in FIG. 14 (B). After the forming gate electrode 65 as shown in FIG. 15 (A) and FIG. 15 (B), an inorganic compound film 67 is formed on the surface of the sample as exemplified in FIG. 16 (A) and is annealed to activate electrically the implanted element. In this embodiment, an SiO film of 1500 Å in thickness, formed by vapor deposition in a vacuum, is used as the inorganic compound film 67. As the material of film 67, there can be used any insulating compounds which do not react with semiconductor substrate 62 and gate electrode 65 during annealing and there is no particular limitation as to the material and forming method.

When the sample is subjected to a plasma anodic oxidation as shown in FIG. 16 (B), the plasma oxidation proceeds on the both sides of gate electrode 65 only, said sides not being covered with the inorganic compound film 67, and thus the insulating compound film 66 is formed on the both sides of the gate electrode 65 by chemically altering the gate electrode.

Then, the production process is completed by removing the inorganic compound film 67, depositing an ohmic metal by vapor deposition in a vacuum and thus forming the source electrode 63 and the drain electrode 64, as shown in FIG. 16 (C).

In the step of FIG. 16 (B), the second active layer 62' is formed by ion implantation and thereafter, a high concentration layer of about $10^{18}$ cm$^{-3}$, i.e. a so-called n+ layer, can be formed near the surface only. This is effective means for improving the ohmic properties of the source electrode 63 and the drain electrode 64.

Since gate electrode 65 satisfies the requirement of the present invention if it serves as a mask for ion implantation or thermal diffusion and has a resistance to a high temperature process such as annealing or the like, as the material thereof, not only can Ti-W alloys be used, but also materials which are not reactive with semiconductors even at a high temperature, e.g. about 800° C., and which are excellent in their heat resistance, for example, metals such as Ta, Nb, V, Mo and the like. Surface insulation of gate electrode 65 is not limited to the plasma oxidation employed in this embodiment, but can be carried out by formation of an oxide film such as by anodic oxidation or thermal oxidation, or by formation of a nitride film such as by plasma nitrification.

Examples of making the field effect transistors having the structures shown in FIG. 14 (A) and FIG. 14 (B) by ion implantation have been illustrated above, but they can be produced by the thermal diffusion method. That is, a shallow diffusion layer corresponding to the active layer 62' of FIG. 14 (A) is firstly formed by contacting a dopant with a small diffusion constant with the surface of substrate, followed by thermal diffusion, a mixed diffusion layer consisting of a shallow diffusion layer and a deep diffusion layer, corresponding to the active layer 62" of FIG. 15 (B) is then formed by contacting another dopant with a large diffusion constant with the site not directly under a gate using the masking pattern 67 as a shield, followed by thermal diffusion, and finally, the electrodes 63, 64 and 65 are formed in an analogous manner to the above described embodiment. Alternatively, the structures of FIG. 14 (A) and FIG. 14 (B) can be realized by depositing a dopant with a small diffusion constant on a gate part while depositing another dopant with a large diffusion constant on between a gate and source, and then subjecting both the zone to thermal diffusion simultaneously.

As apparent from the foregoing illustration, in the fifth embodiment of the present invention, the same effect or merits can be obtained as in the first to fourth embodiment and the gap between the gate electrode 65 and the source electrode 63 can be decreased more remarkably. That is to say, the source series resistance can be reduced to a very small value because both the electrodes are set apart by insulating film 66 only and can be formed in the vicinity of several thousands Å.

The sixth embodiment of the present invention will not be illustrated.

Figure 17:
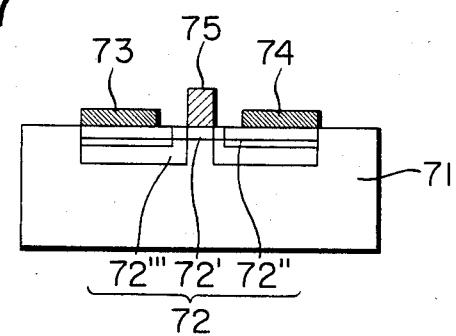
FIG. 17 is a cross-sectional view of the sixth embodiment of the field effect transistor according to the present invention.

FIG. 17 is a cross-sectional view of the sixth embodiment of the MESFET according to the present invention, which comprises semi-insulating semiconductor substrate of GaAs 71, an n-type active layer 72, a source electrode 73, a drain electrode 74 and a Schottky gate electrode 75. In the structure of FIG. 17, the surface of the active layer is flat and the thickness of the active layer 72''' between a gate and source is larger than that of active layer 72' directly under the gate. In particular, the gate electrode 75, the ohmic implanted zone and the deep implanted zone are formed through self-alignment. This embodiment has various advantages, i.e. a small source resistance, a simple production process, an increased yield, a possibility of fine working, etc.

Figure 18:
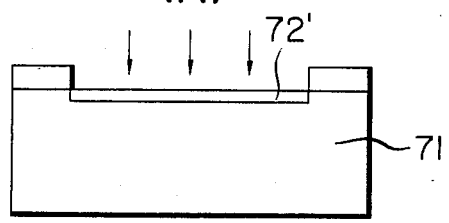
FIGS. 18 (A), (B), (C) and (D) are cross-sectional views to illustrate, in order, the steps of making the transistor of the present invention as shown in FIG. 17.
Figure 18:
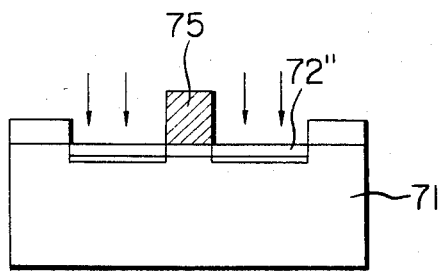
Figure 18:
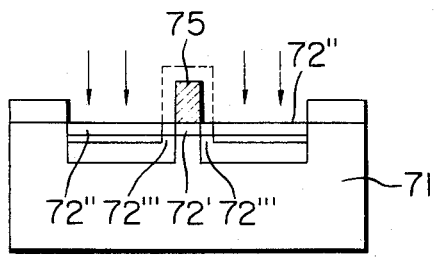
Figure 18:
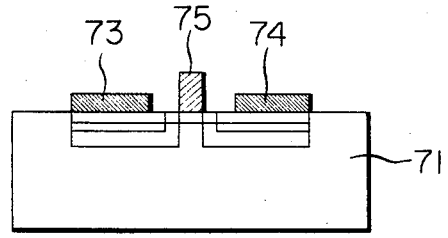

FIGS. 18 (A) to FIGS. 18 (D) are cross-sectional views used to illustrate a process of making an MESFET according to the present invention as shown in FIG. 17. Referring to FIG. 18 (A), firstly, $^{28}Si^+$ ions are implanted in the surface of semi-insulating semiconductor crystal substrate of GaAs 71 to form an active layer 72' with a uniform thickness. The thickness and carrier concentration of this active layer are so selected that a desired pinch-off voltage, e.g. $+0.3$ to $-3$ V be obtained. For example, a carrier concentration of about $10^{17}$ cm$^{-3}$ and an active layer with a thickness of about 0.1 μm are required for realizing a pinch-off voltage of $-2.2$ V and as ion implantation conditions, there are chosen an implantation energy of 120 KeV and an implantation quantity of $2 \times 10^{12}$ dose/cm$^2$ where the doping efficiency is regarded as 100%. The theoretical value of the carrier concentration distribution is shown by the chain line 58 in FIG. 13.

After forming the active layer 72' with a uniform thickness, a stripe-like pattern 75 consisting of a high melting point metal such as TiW is formed thereon as shown in FIG. 18 (B). Using this pattern 75 as a mask, the second ion implantation is carried out to form an n+ layer 72" having a large carrier concentration on the non-masked site. The conditions of the second ion implantation are that the carrier concentration of the surface is so large, for example, an implantation energy of 50 KeV and implantation quantity of $2 \times 10^{13}$ dose/cm$^2$ that, a good ohmic electrode is formed.

As shown in FIG. 18 (C), the surface of a high melting point metal pattern 75 is etched with an isotropic etchant such as phosphoric acid or dilute hydrofluoric acid to reduce the pattern width. Using this pattern as a mask, the third ion implantation is carried out to form a new active layer 72''' having a carrier concentration substantially similar to that of the active layer 72' and a thickness larger than that of the active layer 72' in a zone 72''' between the n+ layer 72" and the metallic pattern 75. The conditions of the third ion implantation are that the implantation energy is made larger than that used in the first ion implantation and the implantation quantity is chosen in such a range that the final peak carrier concentration is not too large to prevent the dielectric breakdown by a voltage applied to a gate and to prevent an excessive increase of the gate capacitance. When an implantation energy of 400 KeV and an implantation quantity of $3.9 \times 10^{12}$ dose/cm$^2$ are chosen as such implanting conditions, for example, the theoretical value of the carrier concentration distribution is shown by broken line 59 in FIG. 13. The concentration of active layer 72''' corresponds to the sum of the concentration by the first ion implantation plus the concentration by the third ion implantation, which distribution is shown by the solid line 60 in FIG. 13.

As can be seen from FIG. 13, the total number of carriers in the active layer 72''' is about three times higher than that in active layer 72' directly under the gate electrode 75 and, consequently, the gate-source resistance can be reduced to about ⅓ or less as compared with the case where the active layer 72''' is uniformly formed to be same as the active layer 72'. On the other hand, since the peak carrier concentration in the active layer 72''' becomes only about 13% more than that in the active layer 72', a decrease in the breakdown voltage of a gate and an increase of the gate capacitance are held very small.

A heat treatment is then carried out at 800° C. for 20 minutes in an N$_2$ atmosphere to effect electrical activation of the implanted ion. Finally, ohmic electrodes are formed on the ohmic zone as shown in FIG. 18 (D), thus obtaining a field effect transistor.

It is favorable to the device characteristics for that the length of active layer 72' in FIG. 17 to be short. However, shortening of this length is limited by fine photolithography techniques.

The relationship between the length of the active layer 72' and that of the gate electrode 75 will now be illustrated. In the case of a "normally on" type, which has a relatively thick active layer 72', even if the length of the active layer 72' is somewhat longer than that of the gate electrode 75, the properties are not significantly deteriorated, because such a problem does not arise in that the part of active layer 72' not directly under a gate significantly increases the resistance between the gate and source since the active layer 72' is relatively thick and accordingly, the thickness of a depletion layer from the surface toward the inside does not extend to the whole thickness of the active layer 72'.

On the contrary, in the case of "normally off" type, in which the shallow active layer 72' is relatively thin, if the length of the shallow active layer 72' is greater than that of the gate electrode 75, the depletion layer in the region not directly beneath the gate will extend completely to the bottom of the shallow active layer, thus resulting in a problem in that the resistance between the gate and source is markedly increased and in an extreme case, electrical current is completely interrupted.

In the "normally off" type, therefore, the length of the gate electrode 75 should be larger than that of the active layer 72'. However, a part of the gate electrode 75, exceeding the length of active layer 72' increases only the electrostatic capacity and has no effective function and, accordingly, it is desirable to hold the part exceeding the layer 72' as short as possible so as to increases the operation speed of the element. That is, ideally, it is effective to form the gate electrode 75 and the active layer 72' so as to have equal length as shown in FIG. 17, in particular, in the "normally off" type.

According to this embodiment, using the gate electrode 75 as a mask, the an n+ layer is formed and the a deep ion implantation is carried out, so the gate electrode, deep implanted layer and n+ layer are formed through self-alignment. Thus, the active layer 72' and the gate electrode 75 are formed on the same site and with the same length and moreover, the n+ layer 72" and the gate electrode 75 are formed in an adjacent position, thus resulting in a further decreased source series resistance and remarkably improved characteristics of the "normally off" type.

The seventh embodiment of the present invention will now be illustrated.

Figure 19:
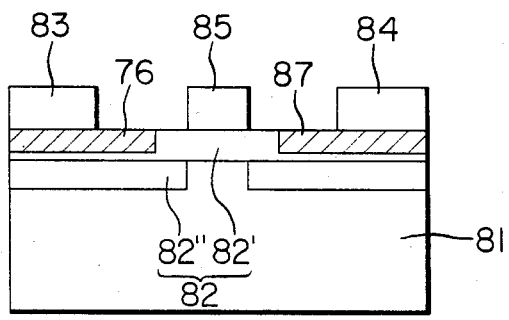
FIG. 19 is a cross-sectional view of the seventh embodiment of the field effect transistor according to the present invention.

FIG. 19 is a cross-sectional view of the MESFET according to the present invention, which comprises a semi-insulating semiconductor substrate of GaAs 81, an n-type active layer 82, a source electrode 83, a drain electrode 84 and a Schottky-barrier gate electrode 85. In the structure of FIG. 19, the surface of the active layer is flat and the thickness of the active layer 82" between a gate and source is larger than that of the active layer 82' directly under the gate. Gate electrode 85 is correctly positioned to exactly coincide with the active layer 82' without overlapping any of the active layer 82", and n+ layers 86 and 87 are formed at the both sides of gate electrode 85 in the vicinity of about 0.5 μm.

According to this embodiment of the MESFET of the present invention, as described above, the thick active layer 82" and the n+ layer are provided between the gate electrode 85 and the source electrode 83 and the n+ layer 86 and the gate electrode 85 are provided so as to be sufficiently adjacent, for example, by about 0.5 μm, thus resulting in a decreased source resistance and good high frequency characteristics.

Figure 20:
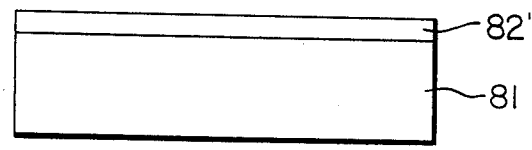
FIGS. 20 (A), (B), (C) and (D) are cross-sectional views to illustrate, in order, the steps of making the transistor of the present invention as shown in FIG. 19.
Figure 20:
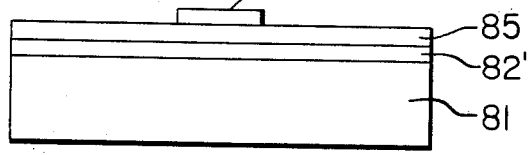
Figure 20:
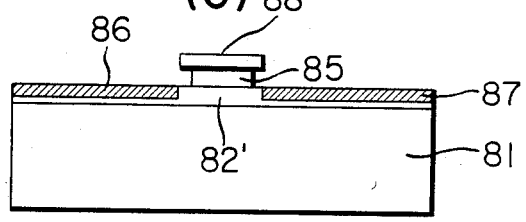
Figure 20:
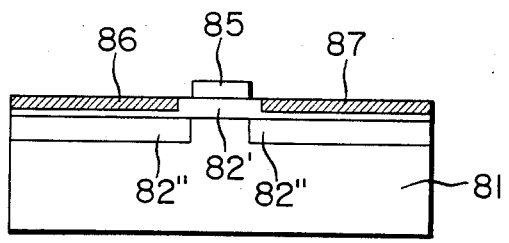

FIGS. 20 (A) to FIGS. 20 (D) are cross-sectional views used to illustrate an example of a process for the production of an MESFET according to the present invention as shown in FIG. 19. As shown in FIG. 20 (A), $^{28}Si^+$ ions are implanted in the surface of the semi-insulating substrate of GaAs 81 to form the active layer 82' with a uniform thickness. The thickness and carrier concentration of this active layer are selected suitably so as to give a desired pinch-off voltage, e.g. +0.3 to −3 V. For example, a carrier concentration of about $10^{17}$ cm$^{-3}$ and an active layer of about 0.1 μm in thickness are required for realizing a pinch-off voltage of −2.2 V and as ion implantation conditions, there are chosen an implantation energy of 120 KeV and an implantation quantity of $2 \times 10^{12}$ dose/cm$^2$ where the doping efficiency is regarded as 100%. The theoretical value of the carrier concentration distribution obtained under these conditions is shown by the chain line 58 in FIG. 13.

After forming active layer 82' with a uniform thickness, a high melting point metal 85 not reactive with GaAs, such as Ti, Ta, W, V, Nb, Mo or alloys thereof, is vapor-deposited on the active layer 82' and a further photoresist pattern 88 is formed thereon, as shown in FIG. 20 (B). Using this photoresist pattern 88 as a mask, a metal 85 is subjected to etching and further to side etching to form a metal pattern 85 narrower than photoresist pattern 88 under this pattern 88 as shown in FIG. 20 (C). Thereafter, using this photoresist pattern 88 as a mask, the second ion implantation is carried out to form n+ layers 86 and 87 on the non-masked sites.

Then, resist 88 is removed and using pattern 85 as a mask, the third ion implantation is carried out to form a new active layer 82" on the non-masked sites, as shown in FIG. 20 (D). The ion implanting conditions of the third processing are that the implantation energy is made larger than that used in the first ion implantation and the implantation quantity is chosen in such a range that the final peak carrier concentration is not too large to prevent the dielectric breakdown by a voltage applied to a gate and to prevent an excessive increase of the gate capacitance. When an implantation energy of 400 KeV and an implantation quantity of $3.9 \times 10^{12}$ dose/cm$^2$ are chosen as such implanting conditions, for example, the theoretical value of the carrier concentration distribution is shown by the broken line 59 in FIG. 13. The concentration of the part of the layer 82" where the second ion implantation has not been carried out, i.e.-of the non-masked part of active layer 82, corresponds to the sum of the concentration by the first ion implantation and that by the third ion implantation, whose distribution is shown by the solid line 60 in FIG. 13.

As can be seen from FIG. 13, the total number of carriers in the active layer 82" between the n+ layers 86 or 87 and the active layer 82' is about three times higher than that in the active layer 82' directly under the gate electrode 85 and, cosequently, the gate-source resistance can be reduced to about ⅓ or less as compared with the case where the active layer 82" is uniformly formed to be the same as the active layer 82'. On the other hand, since the peak carrier concentration in the active layer 82" becomes only about 13% more than that in the active layer 82', decrease of the breakdown voltage of a gate and increase of the gate capacitance are held very small.

Electrical activation of the implanted element is then carried out by annealing and the source electrode 83 and the drain electrode 84 are formed on predetermined sites of the n+ layers 86 and 87, thus obtaining an MESFET as shown in FIG. 19.

According to the embodiment of the present invention, the characteristics of "normally off" type can remarkably be improved, because the active layer 82' and the gate electrode 85 are formed on the same site and with the same length through self-alignment by carrying out ion implantation using the pattern 85 as a mask.

The shorter the length of the active layer 82" between the n+ layer 86 or 87 and the active layers 82' is, the smaller the series resistance between the gate and source. This gives a favorable performance. In this embodiment, the length of the active layer 82" depends on the contraction difference between the patterns 85 and 88 and can be very small, e.g. approximately 0.5 μm.

In the foregoing embodiments of the present invention, GaAs is used as a semiconductor crystal, but if necessary, InP or other Group III-Group V compound semiconductors or other semiconductors such as Si can be used.

As apparent from the foregoing detailed description, according to the present invention, there is provided an MESFET which is excellent in its high frequency characteristics, exhibits a high breakdown voltage and can be produced with a high yield, because an active layer between a gate and source is thick, the carrier concentration is substantially constant over the whole active layer and the surface of the active layer is made flat.

What is claimed is:

1. A process for fabricating a Schottky-barrier gate field effect transistor comprising the steps of: forming a first active layer of one electrically conductive type semiconductor crystal with a thickness and carrier concentration chosen so as to give a predetermined pinch-off voltage, forming a stripe-like resist pattern thereon, introducing an impurity for giving the same electrically conductive type as the first active layer into the first active layer by ion implantation or thermal diffusion selectively through the pattern as a mask to form a second deeper active layer at the both sides of the first active layer such that said second active layer has a carrier concentration substantially equal to that of said first active layer, forming a reversed pattern rightly to the stripe-like pattern by the lift off method, vapor depositing a Schottky gate metal thereon, forming a Schottky gate electrode positioned correctly on the first active layer by removing the reversed pattern mask and forming a source electrode and drain electrode on the second deeper active layer.

2. The process of claim 1, wherein the first active layer is formed by implanting $^{28}Si^+$ ions uniformly in semi-insulating GaAs substrate.

3. The process of claim 1, wherein the pinch-off voltage ranges from $+0.3$ to $-3$ V.

4. The process of claim 1, wherein the second active layer is formed by a deeper ion implantation than in the formation of the first active layer.

5. The process of claim 1, wherein the first active layer and the second active layer are subjected to annealing to activate electrically the implanted element.

6. The process of claim 1, wherein the reversed pattern is formed by vapor-deposition of Au, followed by lift off.

7. The process of claim 1, wherein the Schottky gate electrode is of a metal selected from the group consisting of Al, Ta, Mo, W and Ti.

8. The process of claim 5, wherein the annealing is carried out while protecting the crystal surface by coating with $Si_3N_4$ or by controlling the partial pressure of As or P at a temperature of 700° to 850° C.

9. A process for the production of a Schottky-barrier gate field effect transistor, which comprises forming a first active layer of one electrically conductive type semiconductor crystal with a thickness and carrier concentration chosen so as to give a predetermined pinch-off voltage, forming a stripe-like pattern consisting of an insulating material, introducing an impurity for giving the same electrically conductive type as the first active layer into the first active layer by ion implanatation or thermal diffusion selectively through the pattern as a mask to form a second deeper active layer at the both sides of the first active layer such that said second active layer has a carrier concentration substantially equal to that of said first active layer, subjecting to annealing to activate electrically the implanted element, forming a source electrode and drain electrode on the second active layer, applying a photoresist thereto to be flat, subjecting to plasma etching to remove a part of the photoresist and to expose the upper part of the pattern from the photoresist, removing the pattern only to expose the first active layer, vapor depositing a gate metal and then removing the photoresist.

10. The process of claim 9, wherein the insulating material is selected from the group consisting of inorganic compounds including silicon nitride, silicon oxide, aluminum oxide and aluminum nitride, and organic resins.

11. A process for the production of a Schottky-barrier gate field effect transistor, which comprises forming an active layer with a uniform thickness, forming a source electrode and drain electrode on the surface of the active layer, forming a masking pattern for forming a gate electrode and an inactivated zone, implanting an inactivating ion through the masking pattern to form an inactivated zone, vapor depositing a metal for a gate electrode and then removing the masking pattern to form a gate electrode.

12. The process of claim 11, wherein the masking pattern is of a photoresist.

13. The process of claim 12, wherein the inactivating ion is selected from the group consisting of $O^+$, $Cr^+$, $B^+$.

14. A process for fabricating a Schottky-barrier gate field effect transistor comprising the steps of: forming a first active layer of one electrically conductive type semiconductor crystal with a thickness and carrier concentration chosen so as to give a predetermined pinch-off voltage, forming a pattern consisting of an insulating material, introducing an impurity for giving the same electrically conductive type as the first active layer into the first active layer by ion implantation or thermal diffusion selectively through the pattern as a mask to form a second deeper active layer at the both sides of the first active layer such that said second active layer has a carrier concentration substantially equal to that of said first active layer, forming an insulating film thereon, and after removing the pattern and subjecting the insulating film to window making, forming a source electrode, drain electrode and gate electrode.

15. The process of claim 14, wherein the insulating material for the pattern is $SiO_2$ and the insulating film is of $Si_3N_4$.

16. A process for fabricating of a Schottky-barrier gate field effect transistor comprising the steps of: forming a first active layer of one electrically conductive type semiconductor crystal with a thickness and carrier concentration chosen so as to give a predetermined pinch-off voltage, forming a stripe-like heat resistance metal film forming high carrier concentration ohmic layer of the same electrically conductive type as the active layer by ion implantation through the stripe-like metal film as a mask, etching a part of the stripe-like metal film with an isotropic etchant to narrow the width thereof, effecting a deeper ion implantation at a larger accelerating voltage through the stripe-like metal film as a mask, subjecting to a heat treatment for the electrical activation of the implanted ions and then forming ohmic metals on the ohmic zones.

17. The process of claim 16, wherein the heat resistance metal is selected from the group consisting of Ti-W alloys, Ta, Nb, V and Mo.

18. The process of claim 16, wherein the isotropic etchant is selected from the group consisting of phosphoric acid and hydrofluoric acid.

19. The process of claim 16, wherein the heat treatment is carried out at 800° C. in an $N_2$ atmosphere.

* * * * *